（12）United States Patent
Berens

(10) Patent No.: US 7,372,342 B2
(45) Date of Patent: May 13, 2008

(54) OSCILLATOR

(75) Inventor: Michael Berens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 19 days.

(21) Appl. No.: 11/461,155

(22) Filed: Jul. 31, 2006

(65) Prior Publication Data

US 2008/0042770 A1 Feb. 21, 2008

(51) Int. Cl.
*H03B 5/36* (2006.01)
(52) U.S. Cl. ............ 331/116 R; 331/109; 331/116 FE; 331/158; 331/159; 331/185
(58) Field of Classification Search ............... 331/74, 331/75, 109, 116 R, 116 FE, 116 M, 117 R, 331/117 FE, 117 D, 158, 159, 182, 183, 331/185, 186
See application file for complete search history.

(56) References Cited

U.S. PATENT DOCUMENTS

| | | | |
|---|---|---|---|
| 4,360,789 A | 11/1982 | Lewyn et al. | 331/109 |
| 4,405,906 A | 9/1983 | Luscher | 331/116 FE |
| 5,450,042 A | 9/1995 | Good et al. | 331/117 FE |
| 6,861,917 B2 | 3/2005 | Stevenson et al. | 331/183 |
| 2007/0109064 A1* | 5/2007 | Micko | 331/158 |

* cited by examiner

*Primary Examiner*—David Mis
(74) *Attorney, Agent, or Firm*—Hamilton & Terrile, LLP; Gary W. Hamilton

(57) ABSTRACT

A high-performance crystal oscillator providing effective bias resistors with low power consumption and minimal substrate surface area. In various embodiments of the invention, a switched-capacitor resistor is operably coupled to circuit components, such as an oscillation source, a current source, an input buffer, or an amplifier to provide a bias resistance.

20 Claims, 3 Drawing Sheets

OSCILLATOR

BACKGROUND OF THE INVENTION

1. Field of the Invention

The present invention relates in general to the field of electronic circuitry and, more specifically, to oscillator circuits.

2. Description of the Related Art

As microelectronic fabrication processes advance, there is an increasing demand for oscillator circuits that are capable of providing accurate, high-gain signal amplification while consuming minimal power. Power consumption of crystal oscillators is very important in many applications because of the need to implement "stop modes" and to perform "wake-ups" with minimal delays related to start-up time for the crystal oscillator. Low-power crystal oscillator designs, especially those employing capacitive coupling, require a large amount of resistance for internal biasing. Current methods for providing bias resistance require trade-offs between size, power consumption, and variability.

Current methods for implementing high-value resistors in crystal oscillators are generally too variable or too expensive. For example, a resistor providing 250 MΩ of resistance requires approximately 1.0 mm$^2$ of silicon area for the highest density passive resistor currently available in a TSMC 0.25 micron process. These resistors could be made smaller; however, the decrease in resistor size comes at the expense of power consumption.

These resistors can be implemented with biased transistors operating in the linear region. However, the resistance provided by this approach is highly variable, with a possible variation of an order of magnitude for 100 mV change in $V_{ds}$. This variation results in clipping and distortion on the oscillator signals, adding undesired harmonics and wasting power. Diode-connected transistors can also be used to provide bias resistance. However, this approach also results in undesired variability, clipping and excessive power consumption.

In view of the foregoing, it is apparent that there is a need for an improved low-power, high performance crystal oscillator circuit. In particular, there is a need for a high-performance crystal oscillator providing effective oscillator bias resistors with low power consumption and minimal substrate surface area.

Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Embodiments of circuitry are described for creating an oscillator circuit. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified drawings in order to avoid limiting or obscuring the present invention. Such descriptions and representations are used by those skilled in the art to describe and convey the substance of their work to others skilled in the art. Various illustrative embodiments of the present invention will now be described in detail with reference to the figures.

Figure 1:
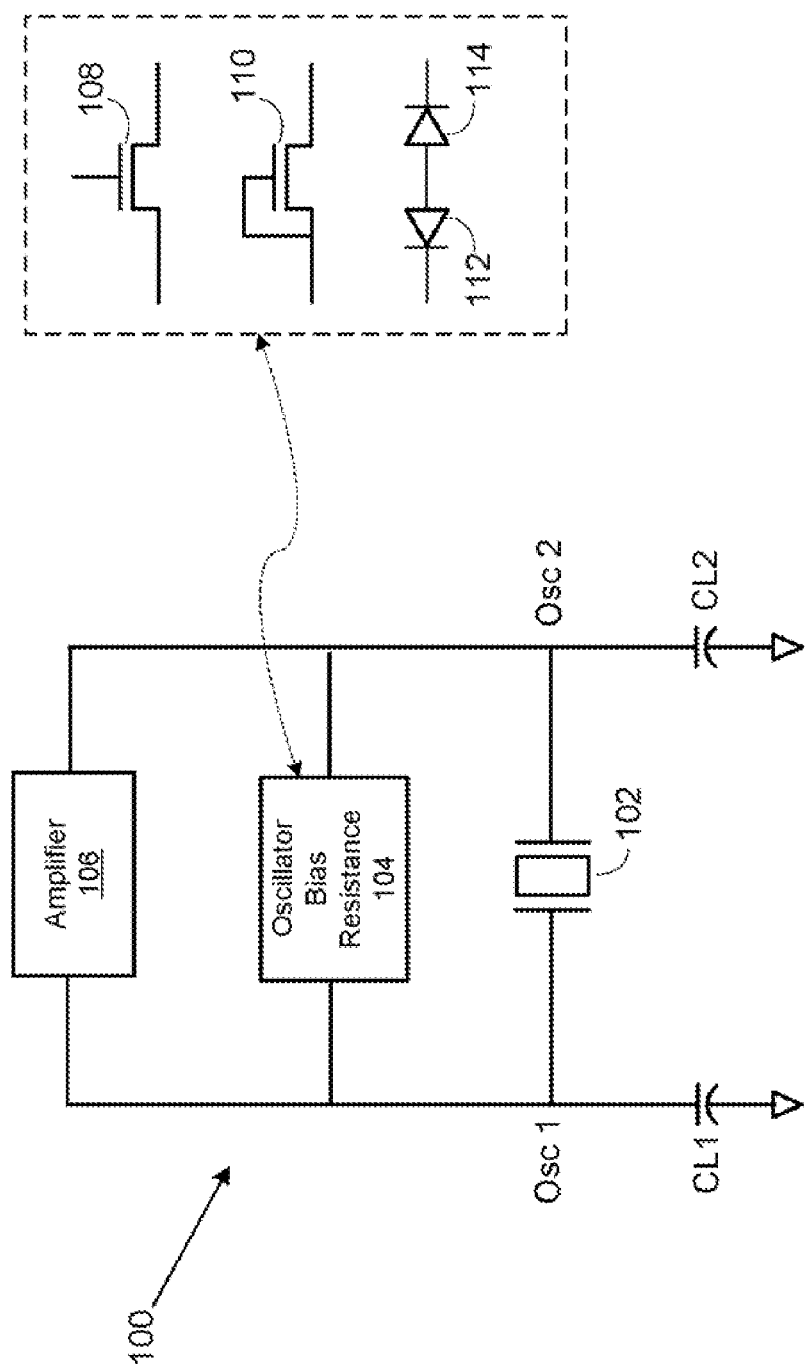
FIG. 1 is an illustration of a prior art oscillator amplifier implemented in an inverter configuration.

FIG. 1 is a schematic illustration of a prior art oscillator amplifier 100. The oscillator amplifier is broadly comprised of a piezo-electric oscillation source 102, an oscillator bias resistance 104, and an amplifier module 106. In various prior art oscillator amplifiers, the oscillator bias resistance 104 is typically implemented using a biased transistor 108, a diode connected transistor 110, or a pair of back-to-back diodes 112, 114, as illustrated in FIG. 1.

Biased transistors, such as transistor 108, generally must operate in the linear region. However, because it is difficult to maintain operation in this region at low supply levels and reasonable oscillation amplitudes, their resistance varies significantly. This can cause clipping and distortion in the oscillator signals, adding undesired harmonics and consuming significant amounts of power. Diode connected transistors 110 also present process variabilities and cause significant clipping and distortion in the oscillator signals, adding undesired harmonics and unnecessary consumption of power. Finally, a bias source comprising back-to-back diodes 112, 114 is generally undesirable because of extremely high temperature variability.

Figure 2:
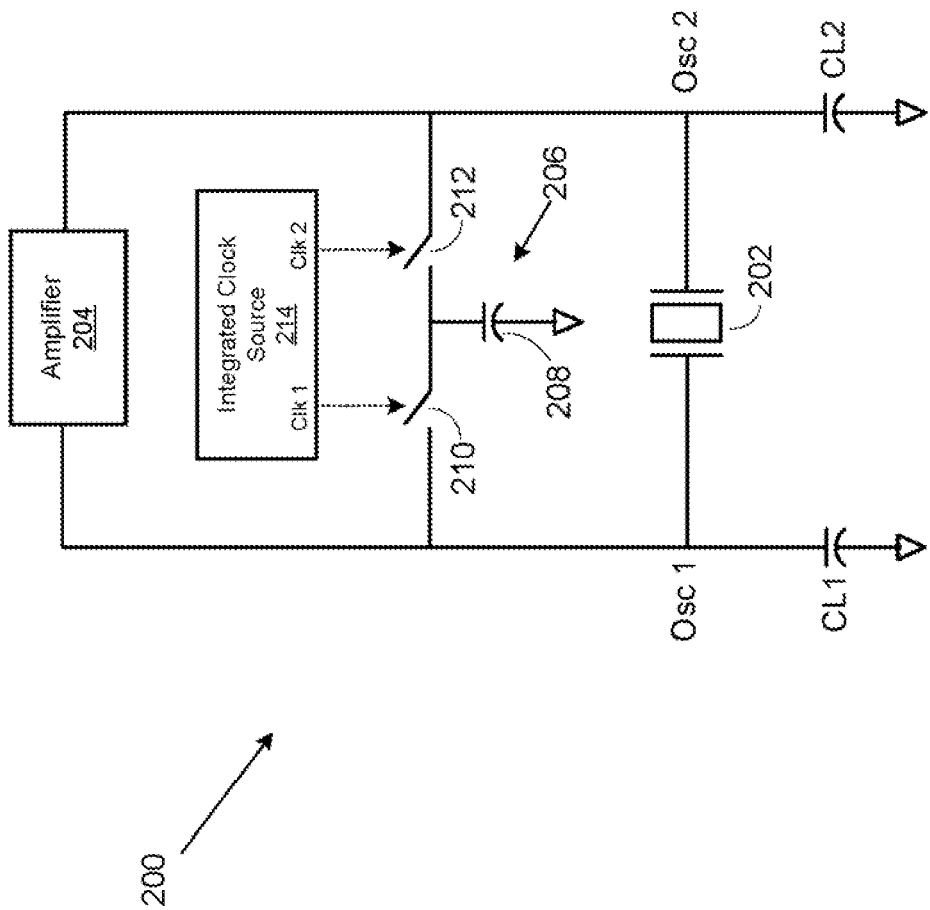
FIG. 2 is an illustration of an oscillator in accordance with an embodiment of the invention.

FIG. 2 is a schematic illustration of an oscillator amplifier 200 in accordance with an embodiment of the present invention. The oscillator amplifier shown in FIG. 2 is broadly comprised of a oscillation source 202 and an amplifier module 204. In various embodiments of the invention, the oscillation source 202 comprises a piezo-electric oscillation source, such as a crystal, or other oscillation sources, such as resonators or precision timing references. As will be understood by those of skill in the art, the oscillation source 202 and the amplifier 204 operate to generate an oscillatory signal with the frequency of the oscillatory signal being determined by the oscillation source 202.

In the embodiment illustrated in FIG. 2, the oscillator bias is provided by a switched-capacitor bias system 206 comprising a capacitor 208 that is controlled by first and second switches 210, 212, respectively. An integrated clock source 214 provides first and second phase-shifted, nonoverlapping clock signals, Clk 1 and Clk 2. The Clk 1 signal controls operation of switch 210 and Clk 2 signal controls operation of switch 212.

Figure 3:
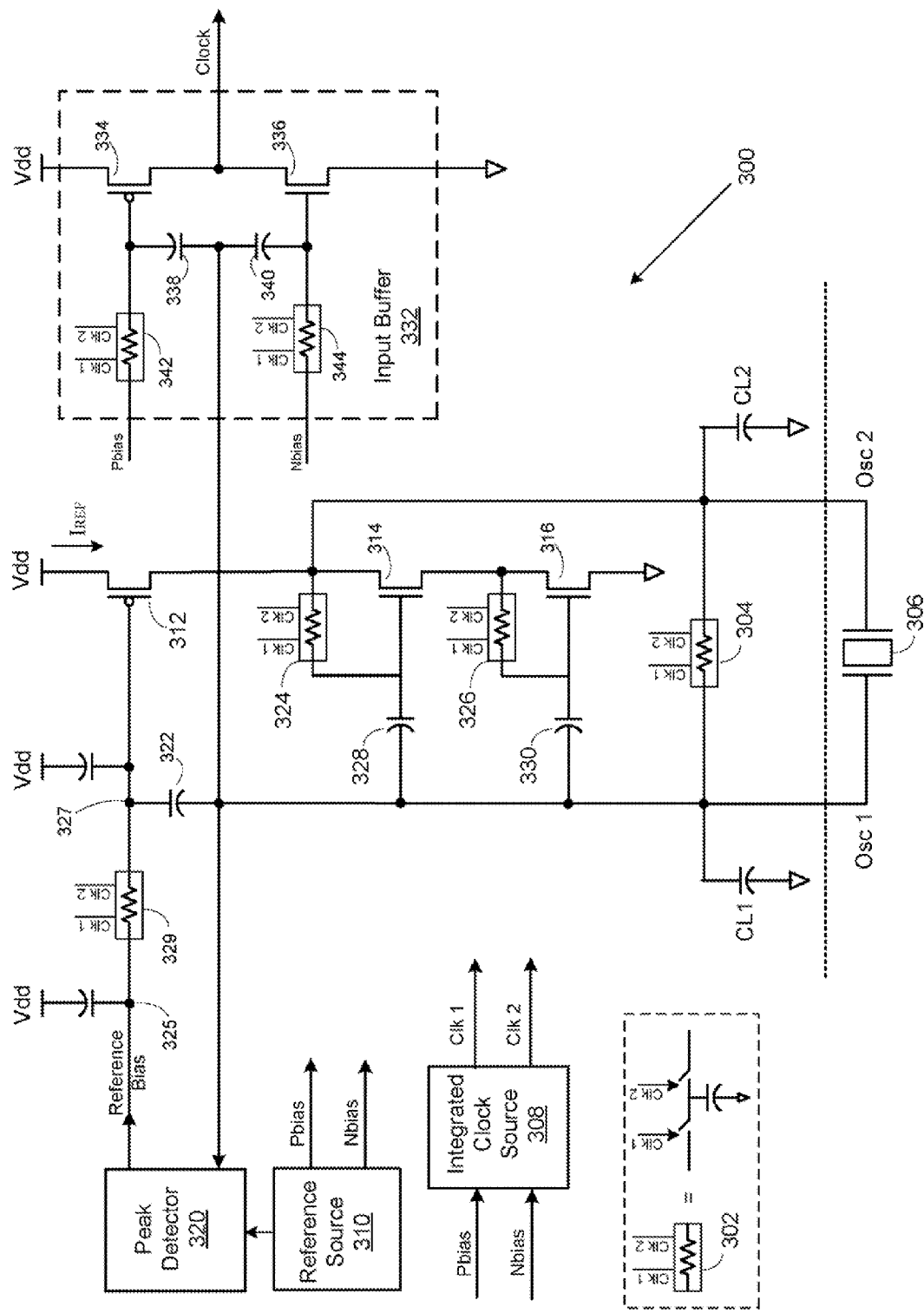
FIG. 3 is a schematic of another embodiment of an oscillator in accordance with the invention.

FIG. 3 is a schematic illustration of an oscillator amplifier 300 wherein switched-capacitor resistors (SCRs) are implemented to provide the oscillator bias and are also implemented for various other functions in the amplifier and input buffer modules. In the embodiment shown in FIG. 3, a switched-capacitor resistor symbol, illustrated generally in reference diagram 302, is used as the equivalent of the switched-capacitor 206 shown in FIG. 2. The various SCRs used in the embodiment shown in FIG. 3 will be given different reference numbers, as appropriate, to facilitate discussion of the advantages of using switched-capacitor resistors in various locations within the oscillator amplifier 300.

The embodiments of the oscillators described herein can be implemented using semiconductor devices of first and second conductivity types, with each of the individual semiconductor devices having a control terminal and first and second current terminals. Various embodiments of the invention may be described using N-type and P-type MOS semiconductor devices. In the example embodiments described using MOS devices, the control terminal will sometimes be referred to as a "gate" and the current terminals will sometimes be referred to as a "source" or "drain," depending on the conductivity type and the potential of the respective terminal. Those of skill in the art will appreciate that embodiments of an oscillator circuit within the scope of the invention can also be implemented using bipolar semiconductor devices. Furthermore, those of skill in the art will appreciate that embodiments within the scope of the invention can be implemented by substituting example semiconductor devices having a first conductivity type with semiconductor devices having a second conductivity type, and vice-versa.

In the embodiment shown in FIG. 3, an SCR 304 is coupled to first and second terminals of the oscillation source 306 to provide biasing for the oscillation source. An integrated clock source 308 receives Pbias and Nbias input signals from a reference source 310 and generates first and second clock signals, Clk 1 and Clk 2, therefrom. The Clk 1 and Clk 2 signals, which are phase-shifted, nonoverlapping clock signals, are used to control operation of the switches in SCR 304 and the other SCRs shown in FIG. 3 using techniques known to those of skill in the art.

The oscillator amplifier 300 further comprises PMOS transistor 312 and NMOS transistors 314 and 316. The source of PMOS transistor 312 is connected to Vdd and its gate is coupled to a peak detector 320 via SCR 329. The peak detector 310 receives a bias input signal from reference source 310 and is also connected to the input node of the oscillation source 306.

The peak detector monitors the peak amplitude of the OSC1 input signal and generates an appropriate reference bias signal to control the amplitude of the reference current provided by the PMOS transistor 312 to the NMOS transistors 314 and 316, thereby maintaining the peak of the OSC1 signal at a predetermined level. This amplitude-controlled reference current is modulated by using capacitor 322 to provide capacitive coupling of the input signal onto the gate of PMOS transistor 312 to improve efficiency. Embodiments of the invention can be implemented using either reference voltages or reference currents that are generated using techniques known to those of skill in the art.

The NMOS transistors 314 and 316 are independently DC biased by diode connections of their respective gates and drains via SCRs 324 and 326, respectively. Each of the NMOS transistors 314 and 316 has the input signal capacitively coupled to its gate by capacitors 328 and 330, respectively. The capacitors 328 and 330 also serve to isolate gates of the NMOS transistors 314 and 316 from leakage currents that typically exist on the OSC 1 terminal. The output of the amplifier is provided at the drain of NMOS transistor 314 which is connected to terminal OSC 2.

The input buffer 332 receives the oscillatory signal OSC1 from the oscillation source 306 and converts it into a square-wave clock signal. The buffer 332 comprises a PMOS transistor 334 and an NMOS transistor 336 that are operable to generate a clock output signal at a node defined by the connection of their respective drains. The gates of the PMOS transistor and the NMOS transistor are AC coupled by capacitors 338 and 340, respectively, to the OSC 1 terminal of the oscillation source 306. The gate of PMOS transistor 334 is also biased by the Pbias signal generated by reference source 310. Likewise, the NMOS transistor 336 is biased by the Nbias signal generated by reference source 310. The Pbias and Nbias DC nodes are isolated from the AC coupled OSC1 signal by bias resistance provided by SCRs 342 and 344, respectively.

The OSC 1 signal generated by the oscillation source 302 is provided as an input to the peak detector 320 that is operable to generate an output signal to bias the PMOS transistor 312. The DC node 325 of the output signal generated by peak detector 320 is isolated from the AC node 327 of the OSC 1 signal by bias resistance provided by SCR 329.

In the various embodiments of the invention, the NMOS transistors 314 and 316 operate in weak inversion, thereby providing the highest possible transconductance for a given bias current. The amplifier and loop voltage gains are proportional to transconductance and are, therefore, also maximized. The NMOS transistor 316 is used to increase the DC bias voltage of the amplifier (VOSC1 and VOSC2) and increase the amplifier gain.

The NMOS transistors 314 and 316 provide excellent amplification and also provide more than twice the DC voltage level of prior art oscillator amplifiers. By summing the Vgs of the NMOS transistors 314 and 316, where the Vgs of transistor 314 is slightly greater than transistor 316 due to its larger Vth (from Vsb>0), it is possible to increase DC level significantly, allowing for greater than 1V peak-to-peak oscillations without clipping at the supply rails with a supply voltage below 1.5V.

As will be appreciated by those of skill in the art, the SCRs used in embodiments of the invention are capable of providing very high bias resistance while using minimal substrate surface area. For example, 1 GΩ of passive poly resistance requires approximately 4.0 mm² of silicon area in a TSMC 0.25 micron process. By contrast, an SCR can provide approximately 1 GΩ of resistance with a module size of approximately 0.025 mm² in a TSMC 0.25 micron process, including the integrated clock source 308. The integrated clock source 308 can be implemented with very little power consumption. For example, the integrated clock source 308 can be implemented in a configuration with a power consumption of only 100 nA, while supporting SCRs that provide bias resistance comparable to passive resistors requiring fifty times more physical area than the SCRs used in embodiments of the invention.

As will be appreciated by those of skill in the art, the embodiments described herein describe a high-performance crystal oscillator providing effective bias resistors with low power consumption and minimal substrate surface area. Embodiments of the invention comprise a source of reference current, an oscillation source operable to use the reference current to generate an oscillatory signal, and a switched-capacitor resistor operably coupled to said oscillation source to provide a bias resistance. Various embodiments of the invention further comprise a first NMOS transistor operably coupled to the oscillation source, wherein the switched-capacitor resistor is coupled to the gate and drain terminals of the first NMOS transistor.

In some embodiments, a second NMOS transistor is operably coupled to the first NMOS transistor and a second switched-capacitor resistor is coupled between the gate and drain of the second NMOS transistor. In the embodiments of the invention, the first and second NMOS transistors are operable to receive the reference current and the oscillatory signal and to generate an amplified oscillatory signal therefrom.

In various embodiments of the invention, a PMOS transistor receives the reference current and provides the reference current to the first and second NMOS transistors. A peak detector may be coupled to the gate of the PMOS transistor to provide a bias voltage to control the magnitude of the reference current provided to said first and second NMOS transistors. In some embodiments, a third switched-capacitor resistor is coupled to the peak detector and the gate of said PMOS transistor to provide a bias resistance for the PMOS transistor.

Various embodiments comprise an input buffer operable to receive the oscillator signal generated by the oscillation source and convert it into a clock signal. The input buffer may comprise a PMOS transistor and an NMOS transistor with switched-capacitor resistors coupled to the gates of the PMOS transistor and the NMOS transistor of the input buffer.

Embodiments of the invention further include a method of generating an oscillatory signal, comprising: providing a reference current; using an oscillation source to generate an oscillatory signal from said reference current; and using a switched-capacitor resistor to provide a bias resistance for said oscillation source. Embodiments of the method further comprise coupling a first NMOS transistor to the oscillation source, wherein the switched-capacitor resistor is coupled to the gate and drain terminals of the first NMOS transistor. In further embodiments of the method, a second NMOS transistor is coupled to the first NMOS transistor; and a second switched-capacitor resistor is coupled between the gate and drain of the second NMOS transistor, wherein the first and second NMOS transistors are operable to receive the reference current and the oscillatory signal and to generate an amplified oscillatory signal therefrom.

In various embodiments of the method, a PMOS transistor receives the reference current and provides the reference current to the first and second NMOS transistors. In these embodiments of the invention, a peak detector may be coupled to the gate of the PMOS transistor to control the magnitude of the reference current provided to the first and second NMOS transistors. A third switched-capacitor resistor may be coupled to the peak detector and the gate of the PMOS transistor to provide a bias resistance for the PMOS transistor.

In various embodiments of the method, an input buffer receives the oscillator signal generated by the oscillation source and converts it into a clock signal. The input buffer may comprise a PMOS transistor and an NMOS transistor, with switched capacitor resistors coupled to the gates of the PMOS and NMOS transistors.

Although the described exemplary embodiments disclosed herein are directed to various examples of an improved oscillator amplifier, the present invention is not necessarily limited to the example embodiments. For example, it will be apparent to those of skill in the art that example embodiments can be modified to substitute NMOS transistors in place of PMOS transistors, using techniques known to those of skill in the art. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An oscillator circuit, comprising:
   an oscillation source operable to generate an oscillatory signal;
   an amplifier operable to amplify said oscillatory signal; and
   a first switched-capacitor resistor coupled to said oscillation source and said amplifier to provide a bias resistance therefor.

2. The oscillator circuit of claim 1, wherein:
   said switched-capacitor resistor is coupled to first and second terminals of said oscillation source.

3. The oscillator circuit of claim 1, wherein:
   said amplifier comprises a first transistor having a first conductivity type; and
   a second switched-capacitor resistor is coupled to the control terminal and a current terminal of said first transistor.

4. The oscillator circuit of claim 3, further comprising:
   a second transistor having a first conductivity type, said second transistor coupled to said first transistor; and
   a third switched-capacitor resistor coupled to the control terminal and a current terminal of said second transistor;
   wherein said first and second transistors are operable to receive said oscillatory signal and to generate an amplified oscillatory signal therefrom.

5. The oscillator circuit of claim 4, further comprising:
   a reference current source operable to provide a reference current to said first and second transistors; and
   a peak detector operable to control the magnitude of the reference current provided to said first and second transistors.

6. The oscillator circuit of claim 5, wherein said reference current source comprises a third transistor, having a second conductivity type, and said peak detector is coupled to the control terminal of said third transistor.

7. The oscillator circuit of claim 6, further comprising a fourth switched-capacitor resistor coupled to said peak detector and said control terminal of said third transistor to provide a bias resistance for said third transistor.

8. The oscillator circuit of claim 7, wherein said first and second transistors comprise NMOS transistors and said third transistor comprises a PMOS transistor.

9. The oscillator circuit of claim 1, further comprising an input buffer operable to receive said oscillatory signal and to generate a clock signal therefrom, said input buffer comprising a PMOS transistor and an NMOS transistor.

10. The oscillator circuit of claim 9, further comprising a fifth switched-capacitor resistor coupled to the control terminal of said PMOS transistor of said input buffer.

11. The oscillator circuit of claim 9, further comprising a sixth switched-capacitor resistor coupled to the control terminal of said NMOS transistor of said input buffer.

12. A method of generating an oscillatory signal, comprising:

using an oscillation source to generate an oscillatory signal;

using an amplifier to amplify said oscillatory signal; and coupling a first switched-capacitor resistor to said oscillation source and said amplifier to provide a bias resistance therefor.

13. The method of claim 12, wherein:

said switched-capacitor resistor is coupled to first and second terminals of said oscillation source.

14. The method of claim 12, wherein:

said amplifier comprises a first transistor having a first conductivity type; and a second switched-capacitor resistor is coupled to the control terminal and a current terminal of said first transistor.

15. The method of claim 14, further comprising:

coupling a third transistor having a first conductivity type to said first transistor; and coupling a second switched-capacitor resistor to the control terminal and a current terminal of said second transistor;

wherein said first and second transistors are operable to receive said oscillatory signal and to generate an amplified oscillatory signal therefrom.

16. The method of claim 15, further comprising:

using a reference current source to provide a reference current to said first and second transistors; and using a peak detector to control the magnitude of the reference current provided to said first and second transistors.

17. The method of claim 16, wherein said reference current source comprises a third transistor, having a second conductivity type, and said peak detector is coupled to the control terminal of said third transistor.

18. The method of claim 17, further comprising:

coupling a fourth switched-capacitor resistor to said peak detector and said gate of said third transistor to provide a bias resistance for said third transistor.

19. The oscillator circuit of claim 18, wherein said first and second transistors comprise NMOS transistors and said third transistor comprises a PMOS transistor.

20. The method of claim 12, further comprising:

using an input buffer to receive said oscillatory signal and to generate a clock signal therefrom, said input buffer comprising a PMOS transistor and an NMOS transistor;

coupling a fifth switched-capacitor resistor to the gate of said PMOS transistor; and coupling a sixth switched-capacitor resistor to the gate of said NMOS transistor of said input buffer.

* * * * *